(12) United States Patent
Cho et al.

(10) Patent No.: US 6,995,452 B2
(45) Date of Patent: Feb. 7, 2006

(54) MOSFET DEVICE WITH NANOSCALE CHANNEL AND METHOD OF MANUFACTURING THE SAME

(75) Inventors: Wonju Cho, Daejeon (KR); Seong Jae Lee, Daejeon (KR); Jong Heon Yang, Daejeon (KR); Jihun Oh, Daejeon (KR); Kiju Im, Daejeon (KR)

(73) Assignee: Electronics and Telecommunications Research Institute, (KR)

( * ) Notice: Subject to any disclaimer, the term of this patent is extended or adjusted under 35 U.S.C. 154(b) by 12 days.

(21) Appl. No.: 10/749,749

(22) Filed: Dec. 30, 2003

(65) Prior Publication Data

US 2004/0203198 A1    Oct. 14, 2004

(30) Foreign Application Priority Data

Apr. 1, 2003    (KR) ...................... 10-2003-0020478

(51) Int. Cl.
*H01L 29/00* (2006.01)

(52) U.S. Cl. ...................... 257/538; 257/607

(58) Field of Classification Search ................ 438/197, 438/257, 264, 303, 305, 306, 307, 529, 549; 257/538, 539, 544, 552, 584, 607
See application file for complete search history.

(56) References Cited

U.S. PATENT DOCUMENTS

| | | | |
|---|---|---|---|
| 5,187,559 A | * | 2/1993 | Isobe et al. ................. 257/538 |
| 5,231,038 A | * | 7/1993 | Yamaguchi et al. ........ 438/303 |
| 6,033,963 A | | 3/2000 | Huang et al. |
| 6,225,173 B1 | | 5/2001 | Yu |
| 6,452,229 B1 | | 9/2002 | Krivokapic |
| 6,455,376 B1 | * | 9/2002 | Fan et al. ................... 438/264 |

FOREIGN PATENT DOCUMENTS

KR    10-1994-030879    10/1998

OTHER PUBLICATIONS

A. Chatterjee, et al. "Sub-100nm Gate Length Metal Gate NMOS Transistors Fabricated by a Replacement Gate Process," Semiconductor Process and Device Center, 1997 IEEE, pps. 821-824.
H-H. Vuong, "Design of 25-nm Salvo PMOS Devices," IEEE Electron Device Letters, vol. 21, No. 5, May 2000, pps. 248-250.

* cited by examiner

*Primary Examiner*—Phuc T. Dang
(74) *Attorney, Agent, or Firm*—Blakely Sokoloff Taylor & Zafman

(57) ABSTRACT

Provided are an SOI MOSFET device with a nanoscale channel that has a source/drain region including a shallow extension region and a deep junction region formed by solid-phase diffusion and a method of manufacturing the SOI MOSFET device. In the method of manufacturing the MOSFET device, the shallow extension region and the deep junction region that form the source/drain region are formed at the same time using first and second silicon oxide films doped with different impurities. The effective channel length of the device can be scaled down by adjusting the thickness and etching rate of the second silicon oxide film doped with the second impurity. The source/drain region is formed on the substrate before the formation of a gate electrode, thereby easily controlling impurity distribution in the channel. An impurity activation process of the source/drain region can be omitted, thereby preventing a change in a threshold voltage of the device. A solid-phase impurity is diffused. Therefore, no crystal defect of a substrate is caused, thereby decreasing a junction leakage current.

8 Claims, 7 Drawing Sheets

MOSFET DEVICE WITH NANOSCALE CHANNEL AND METHOD OF MANUFACTURING THE SAME

BACKGROUND OF THE INVENTION

This application claims priority from Korean Patent Application No. 2003-20478, filed on Apr. 1, 2003, in the Korean Intellectual Property Office, the disclosure of which is incorporated herein by reference in its entirety.

1. Field of the Invention

The present invention relates to a metal-oxide-semiconductor field effect transistor (hereinafter, referred to as "MOSFET") device and a method of manufacturing the same. More particularly, the present invention relates to a silicon-on-insulator (SOI) MOSFET device with a nanoscale channel and a method of manufacturing the same.

2. Description of the Related Art

As silicon semiconductor device technologies progress, the size of a semiconductor device is scaled down to accomplish low power consumption, high integration, and high-speed driving. In particular, metal-oxide-semiconductor (MOS) device technology, which occupies most of silicon semiconductor device technologies, must satisfy the requirement of a decrease in a channel length, a source and drain junction depth, and a gate dielectric film thickness. In addition, devices of the same size can have improved characteristics by an increase in a driving current and a decrease in a leakage current.

A conventional fabrication process for a transistor with a nanoscale channel requires very strict process conditions and high-priced process equipment. That is, since a nanoscale conductive channel cannot be formed by a conventional photolithography process, new patterning technologies such as direct e-beam writing, extreme ultraviolet (EUV) exposure, and X-ray exposure must be used. Therefore, a manufacture cost of a silicon device increases and mass production is difficult. In addition, with respect to conventional ion implantation or plasma doping technologies used in forming a source and a drain, it is difficult to form an ultra-shallow junction, and ion implantation causes a substrate defect, thereby lowering device properties. Also, high-priced junction formation equipment is required. In addition, as the sizes of devices decrease, the thickness of a gate dielectric film decreases, thereby increasing a gate leakage current. In order to solve these problems, studies on a gate dielectric film made of a highly dielectric material have been done. However, since formation of a gate dielectric film precedes formation of a source and a drain in conventional transistor device fabrication technology, the application of a subsequent thermal activation process is restricted. Also, when a nanoscale device is manufactured using a monocrystalline silicon substrate instead of an SOI substrate, there arise serious problems in that it is difficult to form shallow junction for a source and a drain and to obtain device reliability and insulation between devices. In addition, as the doping concentration of an impurity diffusion layer increases, a junction capacity increases.

In this regard, U.S. Pat. No. 6,033,963 discloses a method of forming a metal gate for a CMOS device using a replacement gate process. However, the replacement gate process is very complicated, and it is difficult to perform self-alignment of a gate and a source/drain.

U.S. Pat. No. 6,225,173 B1 discloses a method of manufacturing a MOSFET device with an ultra-shallow source/drain junction using a damascene process. In this patent, however, a complicated process, such as using a CMP process for removal of an insulator, and a high process cost are required.

Therefore, in order to solve the above-described problems and to realize a high performance and highly integrated circuit, a novel method of manufacturing a nanoscale device is necessary.

SUMMARY OF THE INVENTION

The present invention provides a highly reliable and integrated MOSFET device with a nanoscale channel.

The present invention also provides a method of manufacturing a highly reliable and integrated MOSFET device with a nanoscale channel using a silicon-on-insulator (SOI) substrate having good isolation property.

According to an aspect of the present invention, there is provided a MOSFET device comprising: a channel region formed on a monocrystalline silicon layer of a silicon-on-insulator (SOI) substrate; a source/drain region formed in the monocrystalline silicon layer and comprising a deep junction region and a shallow extension region; a first silicon oxide film pattern formed on the monocrystalline silicon layer to contact the deep junction region and doped with a first impurity of a first conductivity type at a first concentration; a second silicon oxide film spacer formed on the monocrystalline silicon layer to contact the shallow extension region and doped with a second impurity of the first conductivity type at a second concentration; a gate electrode formed on the channel region and having a "T" shaped section; and a gate dielectric film interposed between the channel region and the gate electrode.

The first concentration may be higher than the second concentration.

The second silicon oxide film spacer may contact a sidewall of the first silicon oxide film pattern and have an outer wall defining the length of the channel region.

The gate electrode may be formed on the first silicon oxide film pattern and the second silicon oxide film spacer.

The first impurity and the second impurity may be different from each other.

According to another aspect of the present invention, there is provided a method of manufacturing an MOSFET device, which comprises: forming a first silicon oxide film pattern doped with a first impurity of a first conductivity type at a first concentration on an SOI substrate having a monocrystalline silicon layer thereon, the first silicon oxide film pattern having a hole through which a portion of the monocrystalline silicon layer is exposed; forming a second silicon oxide film spacer doped with a second impurity of the first conductivity type at a second concentration on a sidewall of the first silicon oxide film pattern; diffusing the first impurity of the first silicon oxide film pattern and the second impurity of the second silicon oxide film spacer onto the monocrystalline silicon layer to form a source/drain region comprising a deep junction region and a shallow extension region; forming a gate dielectric film on the exposed portion of the monocrystalline silicon layer; and forming a gate electrode with a "T" shaped section on the gate dielectric film.

The second silicon oxide film spacer may be doped with the second impurity at a lower concentration than the first impurity of the first silicon oxide film pattern.

The step of forming the second silicon oxide film spacer may comprise: forming a second silicon oxide film doped with the second impurity at the second concentration on the upper surface and sidewall of the first silicon oxide film pattern and the exposed portion of the monocrystalline silicon layer; and removing portions of the second silicon oxide film by dry etching so that the second silicon oxide film spacer remains.

In the formation of the source/drain region, the first silicon oxide film pattern and the second silicon oxide film spacer may be subjected to a rapid thermal process to diffuse the first impurity and the second impurity.

The method may further comprise doping the exposed portion of the monocrystalline silicon layer with an impurity of the second conductivity type, which is an opposite type to the first conductivity type, to form an ion implantation region for adjusting a threshold voltage, after the formation of the first silicon oxide film pattern. In the formation of the ion implantation region for adjusting the threshold voltage, the impurity of the second conductivity type may be implanted using a photoresist pattern formed on the first silicon oxide film pattern as an ion implantation mask.

According to the present invention, the source/drain region comprised of the shallow extension region and the deep junction region is formed by diffusing an impurity from a solid-phase diffusion source. As a result, a crystal defect of the substrate is not caused and a junction leakage current is decreased. The temperature for the subsequent thermal process after forming the gate dielectric film can be lowered, thereby minimizing a concentration change of an impurity in the channel and thus decreasing a change in the threshold voltage of the device. Therefore, deterioration of device characteristics by a short-channel effect can be prevented, thereby ensuring the reliability of the device. Furthermore, the low temperature for the subsequent thermal process is advantageous in the formation of the dielectric film with a high dielectric constant and the gate electrode made of polycrystalline silicon and metal. Therefore, the present invention can be effectively used in manufacturing a high performance, low-power and high-speed driving, highly integrated SOI MOSFET device and circuit with a nanoscale channel.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
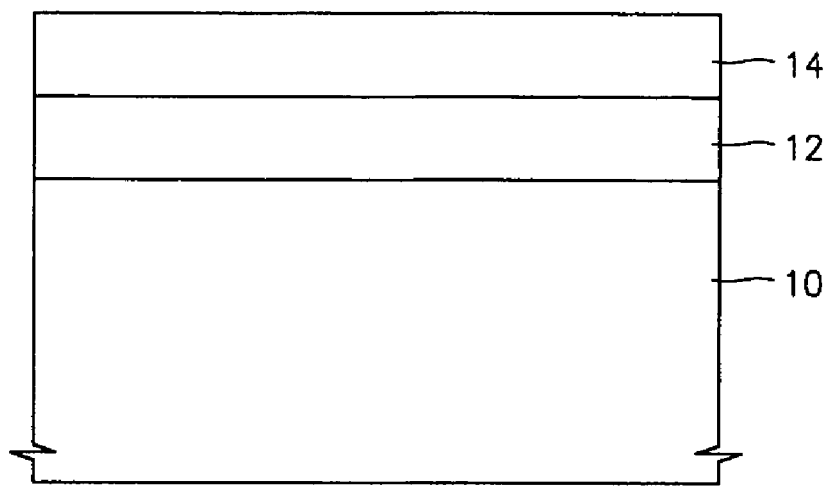
FIGS. 1 through 12 are sectional views that illustrate a process of manufacturing a MOSFET device according to a preferred embodiment of the present invention.

The present invention will now be described more fully hereinafter with reference to the accompanying drawings, in which preferred embodiments of the present invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity.

FIGS. 1 through 12 are sectional views that illustrate a process of manufacturing a MOSFET device according to a preferred embodiment of the present invention.

Referring to FIG. 1, an SOI substrate having a stacked structure of a buried oxide layer 12 and a monocrystalline silicon layer 14 on a monocrytalline substrate 10 is prepared.

Figure 2:
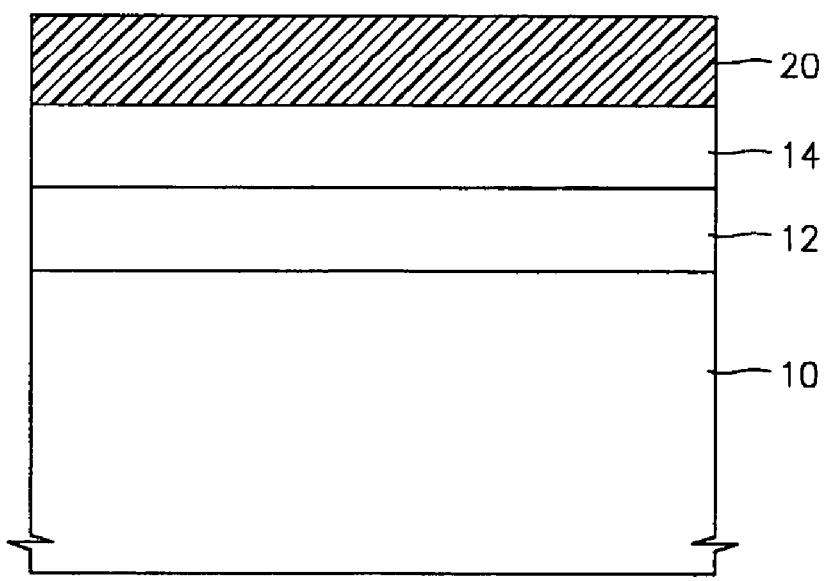

Referring to FIG. 2, a first impurity of a first conductivity type, for example, an n-type is doped at a high concentration on the monocrystalline silicon layer 14 of the SOI substrate to form a first silicon oxide film 20. The first impurity may be phosphorus (P).

The first silicon oxide film 20 may be formed using chemical vapor deposition (CVD), sputtering, or spin coating.

Figure 3:
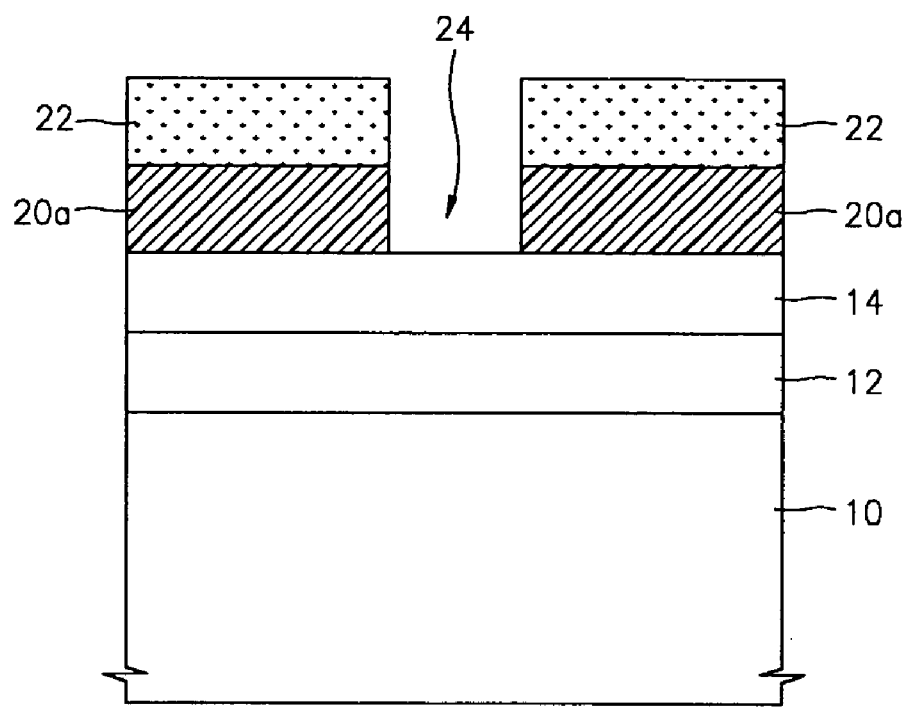

Referring to FIG. 3, a photoresist pattern 22 is formed on the first silicon oxide film 20 to define a channel formation region. The first silicon oxide film 20 is dry etched using the photoresist pattern 22 as an etching mask to form a first silicon oxide film pattern 20a having a hole 24 through which a portion of the monocrystalline silicon layer 14 is exposed. The portion of the monocrystalline silicon layer 14 intended for channel formation is exposed through the hole 24.

The first silicon oxide film 20 is etched by an anisotropic dry etching process with high oxide film selectivity versus a silicon film. In this case, an etching gas such as $CF_4$, $CHF_3$, and $H_2$ may be used.

Figure 4:
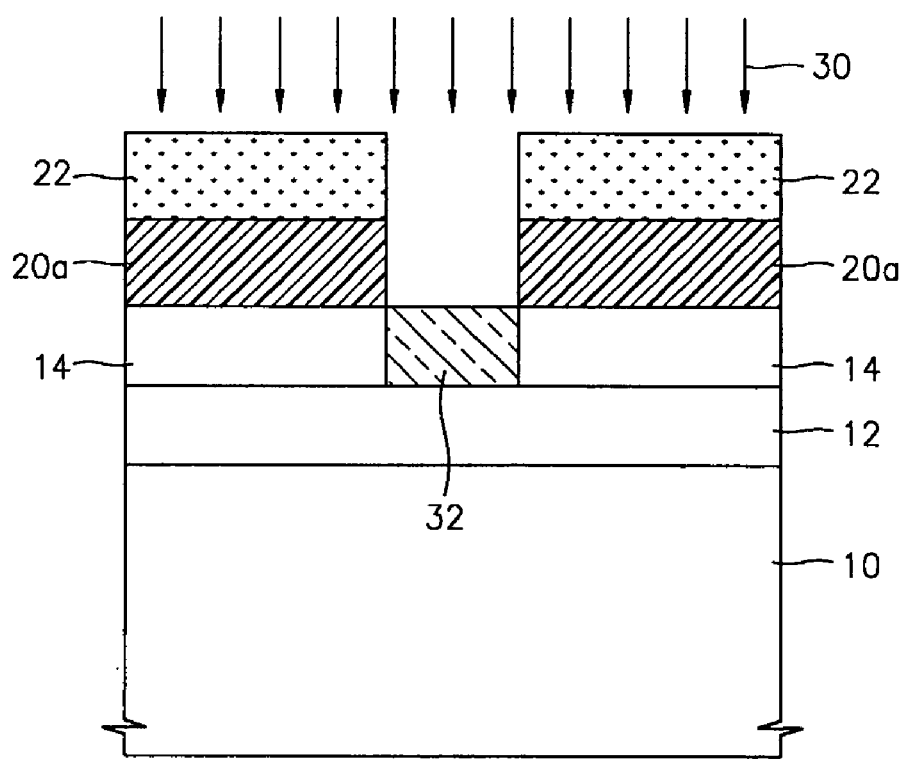

Referring to FIG. 4, a second conductivity type impurity 30, which is an opposite type to the first conductivity type, i.e., for example, a p-type impurity is implanted into the monocrystalline silicon layer 14 using the photoresist pattern 22 as an ion implantation mask. Therefore, the portion of the monocrystalline silicon layer 14 exposed through the hole 24 is doped with the second conductivity type impurity 30, thereby forming an ion implantation region 32. The ion implantation region 32 serves to adjust a threshold voltage and prevent a short-channel effect.

Figure 5:
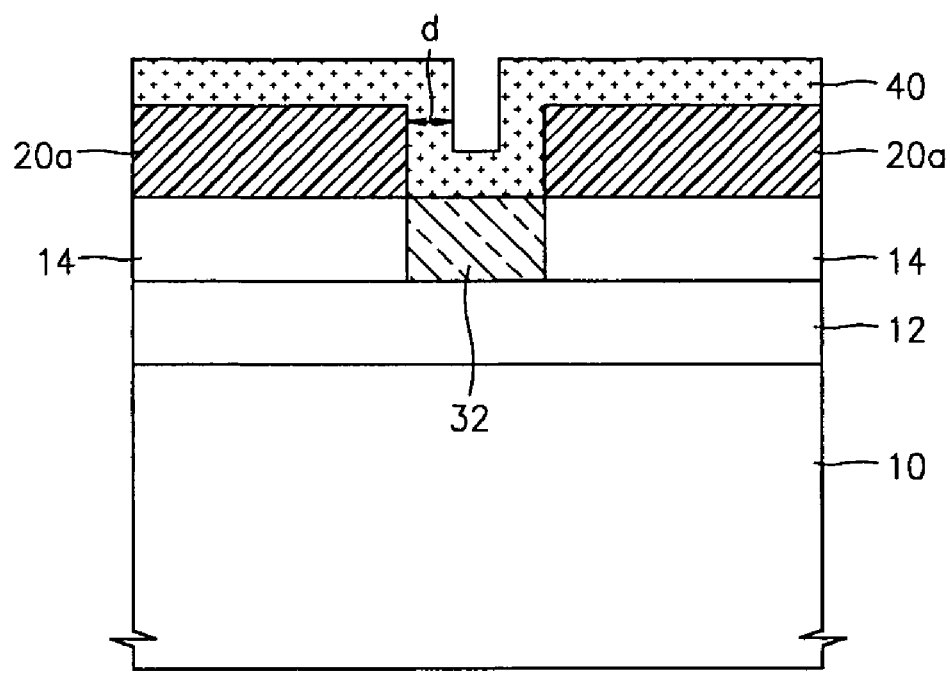

Referring to FIG. 5, after the photoresist pattern 22 is removed, a second impurity of the first conductivity type is doped at a lower concentration than the first impurity of the first silicon oxide film pattern 20a to form a second silicon oxide film 40. The second silicon oxide film 40 wholly covers the upper surface and sidewall of the first silicon oxide film pattern 20a and the exposed portion of the monocrystalline silicon layer 14. The second impurity contained in the second silicon oxide film 40 is different from the first impurity. For example, the second impurity is arsenic (As).

The thickness (d) of the second silicon oxide film 40 is determined depending on the desired driving characteristics of the device and the length of a channel to be formed in a subsequent process.

Figure 6:
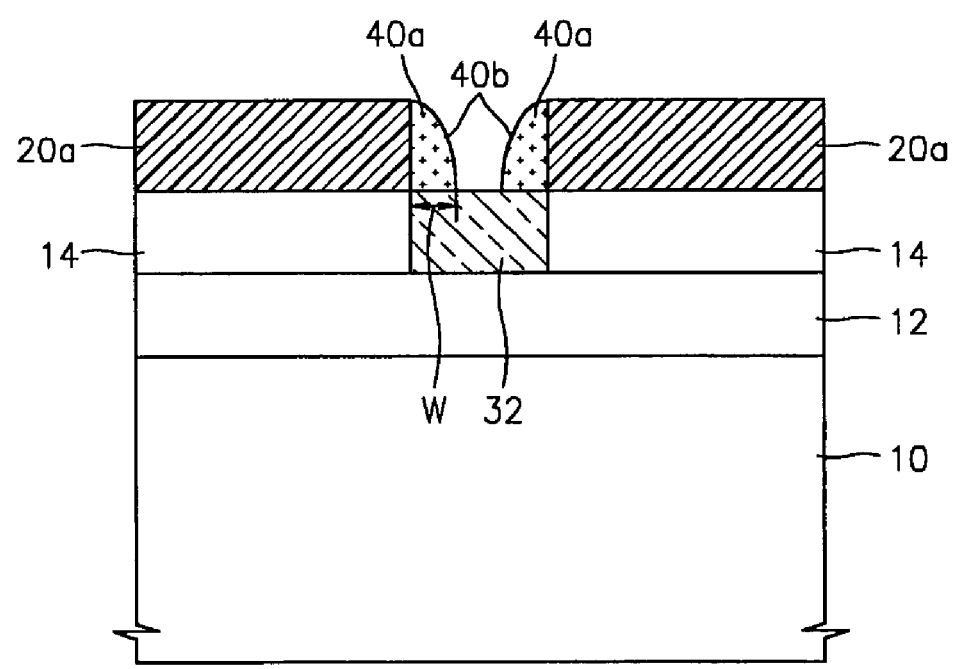

Referring to FIG. 6, a portion of the second silicon oxide film 40 is removed by an etchback process to form a second silicon oxide film spacer 40a on the sidewall of the first silicon oxide film pattern 20a. The width (W) of the second silicon oxide film spacer 40a is determined depending on desired driving characteristics of the device. The channel region length in the ion implantation region 32 is defined by the outer wall 40b of the second silicon oxide film spacer 40a.

The second silicon oxide film 40 is etched by an anisotropic dry etching process under the high etching selectivity of an oxide film to a silicon film. In this case, an etching gas such as $CF_4$, $CHF_3$, and $H_2$ may be used.

Figure 7:
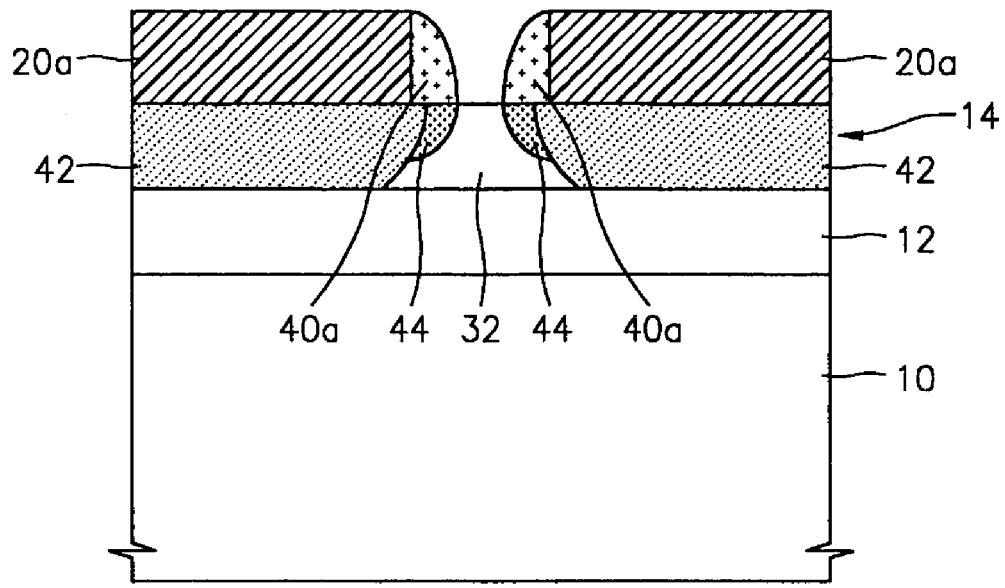

Referring to FIG. 7, the first silicon oxide film pattern 20a and the second silicon oxide film spacer 40a are subjected to a rapid thermal process. As a result, the first impurity of the first silicon oxide film pattern 20a and the second impurity of the second silicon oxide film spacer 40a diffuse to respectively form a deep junction region 42 and a shallow extension region 44 that constitute a source/drain region in the monocrystalline silicon layer 14. In this case, impurity ions contained in the ion implantation region 32 are activated. The degree of the activation determines the threshold voltage of the device.

Figure 8:
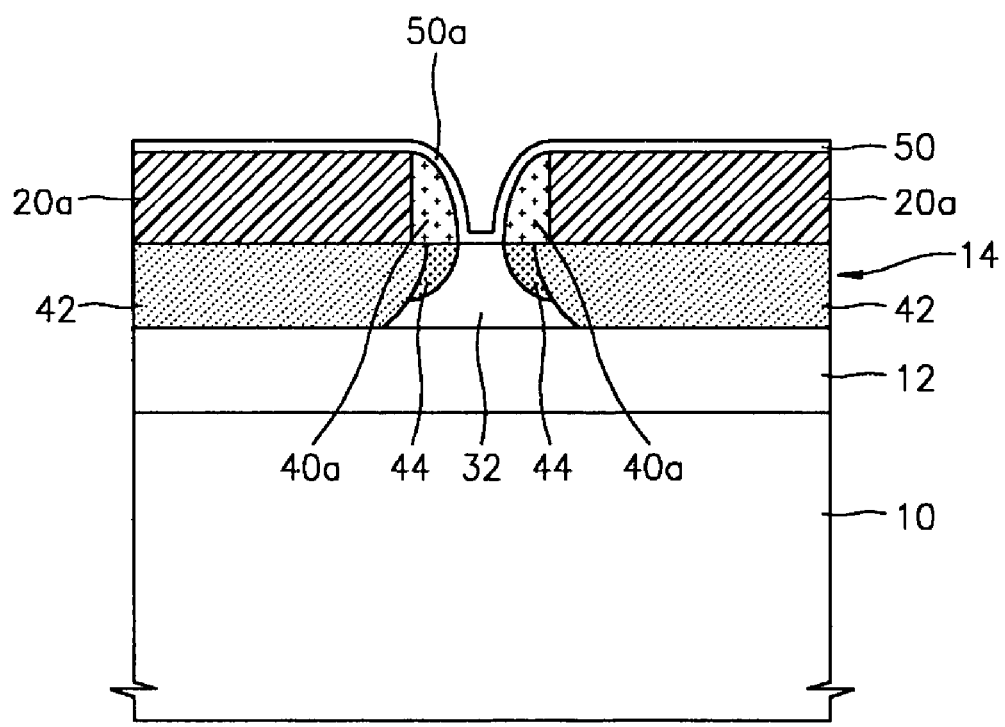

Referring to FIG. 8, an insulating material is deposited on the resultant structure of FIG. 7 to form an insulator 50 over an extended range including the ion implantation region 32, the upper surface of the second silicon oxide film spacer 40a and the upper surface of the first silicon oxide film pattern 20a. The insulator 50 constitutes a gate dielectric film 50a that contacts the ion implantation region 32.

The gate dielectric film 50a may be any dielectric film selected from a silicon oxide film formed by thermal oxidation at a low temperature, an ozone oxide film, a silicon nitride film formed using CVD, a silicon oxide film formed using CVD, or a high dielectric film well known in the gate dielectric film technology field.

Figure 9:
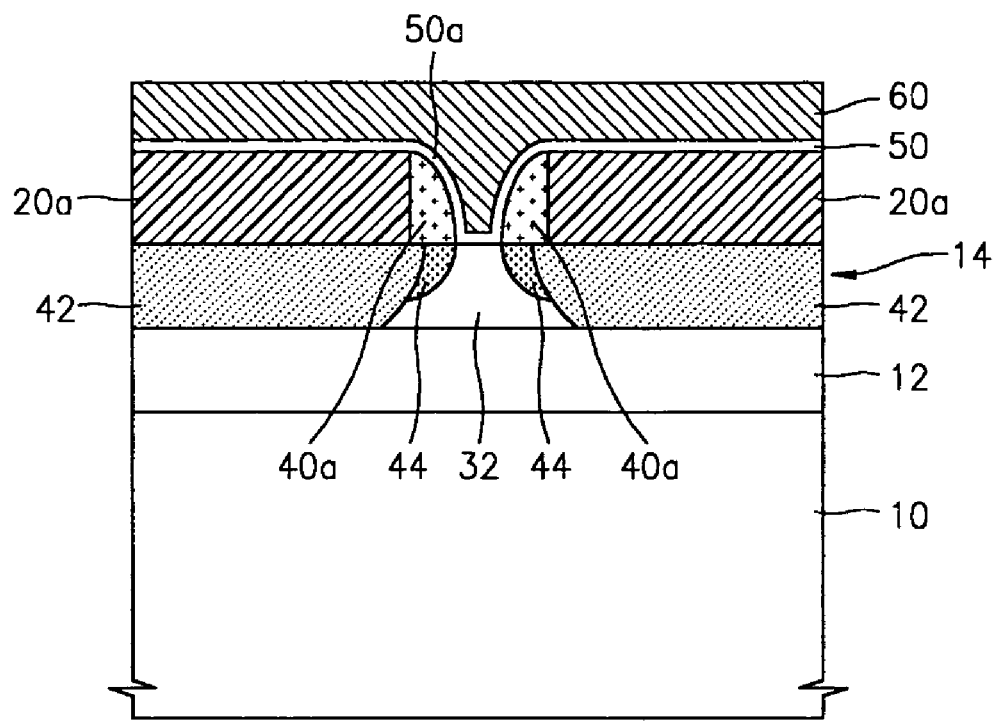

Referring to FIG. 9, a conductive layer 60 for gate electrode formation is formed on the gate dielectric film 50a. The conductive layer 60 may be a conductive polycrystalline silicon layer or a metal layer.

Figure 10:
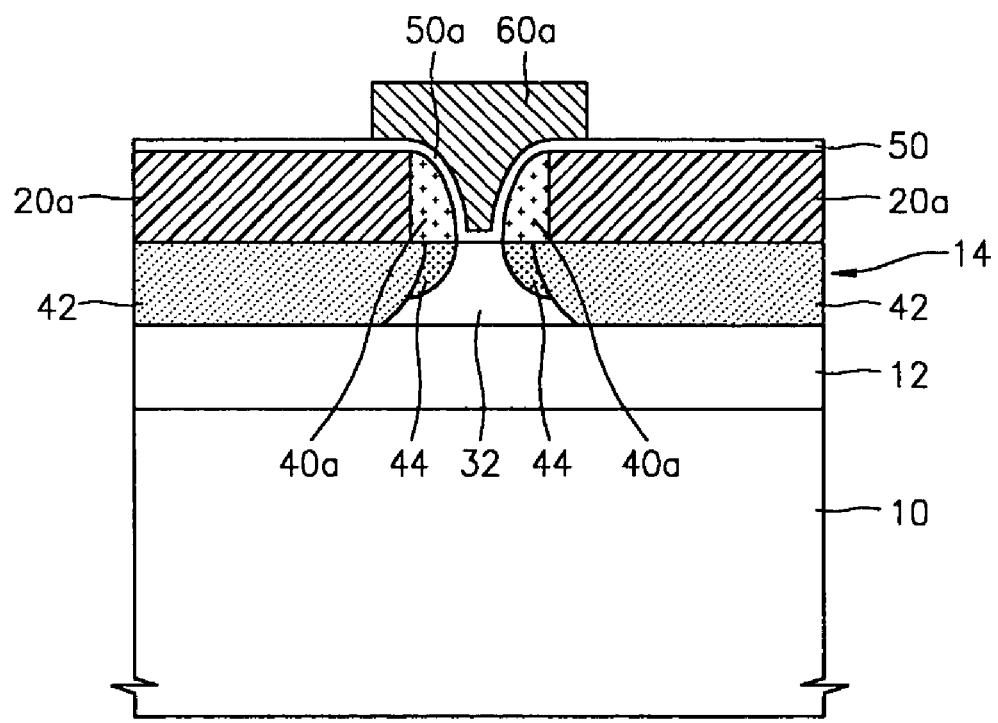

Referring to FIG. 10, the conductive layer 60 is patterned by photolithography to form a gate electrode 60a. The gate electrode 60a has a T-shaped section on the first silicon oxide film pattern 20a and the second silicon oxide film spacer 40a. The gate dielectric film 50a is extended to between the first silicon oxide film pattern 20a and the gate electrode 60a and between the second silicon oxide film spacer 40a and the gate electrode 60a.

Figure 11:
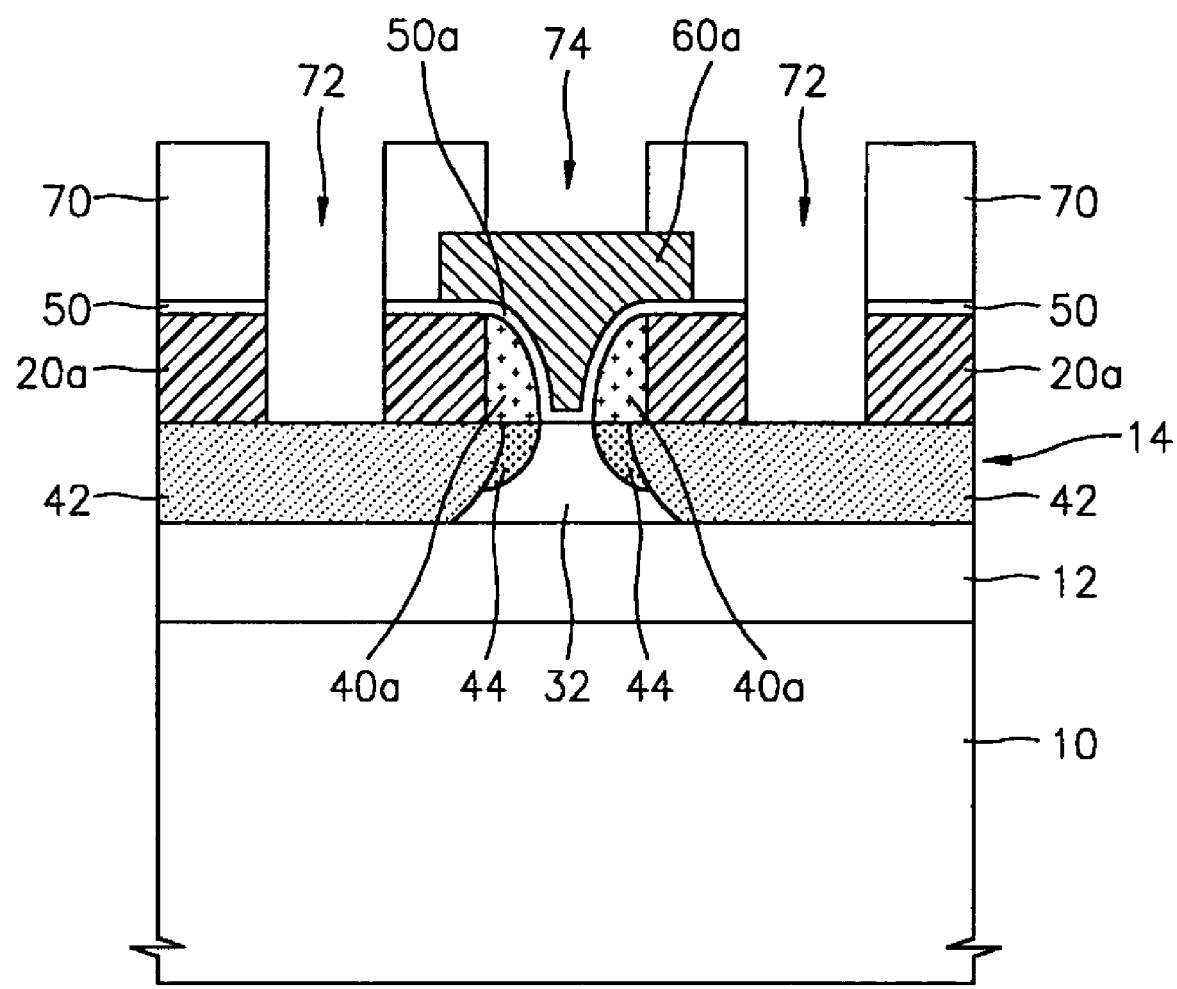

Referring to FIG. 11, an interlayer dielectric film 70 is formed on the resultant structure having the gate electrode 60a to isolate the transistor from other devices or power lines as will be formed on the transistor. Then, the interlayer dielectric film 70, the insulator 50, and the first silicon oxide film pattern 20a are sequentially etched by photolithography to form contact holes 72 and 74 through which the source/drain region and the gate electrode 60a are respectively exposed.

Figure 12:
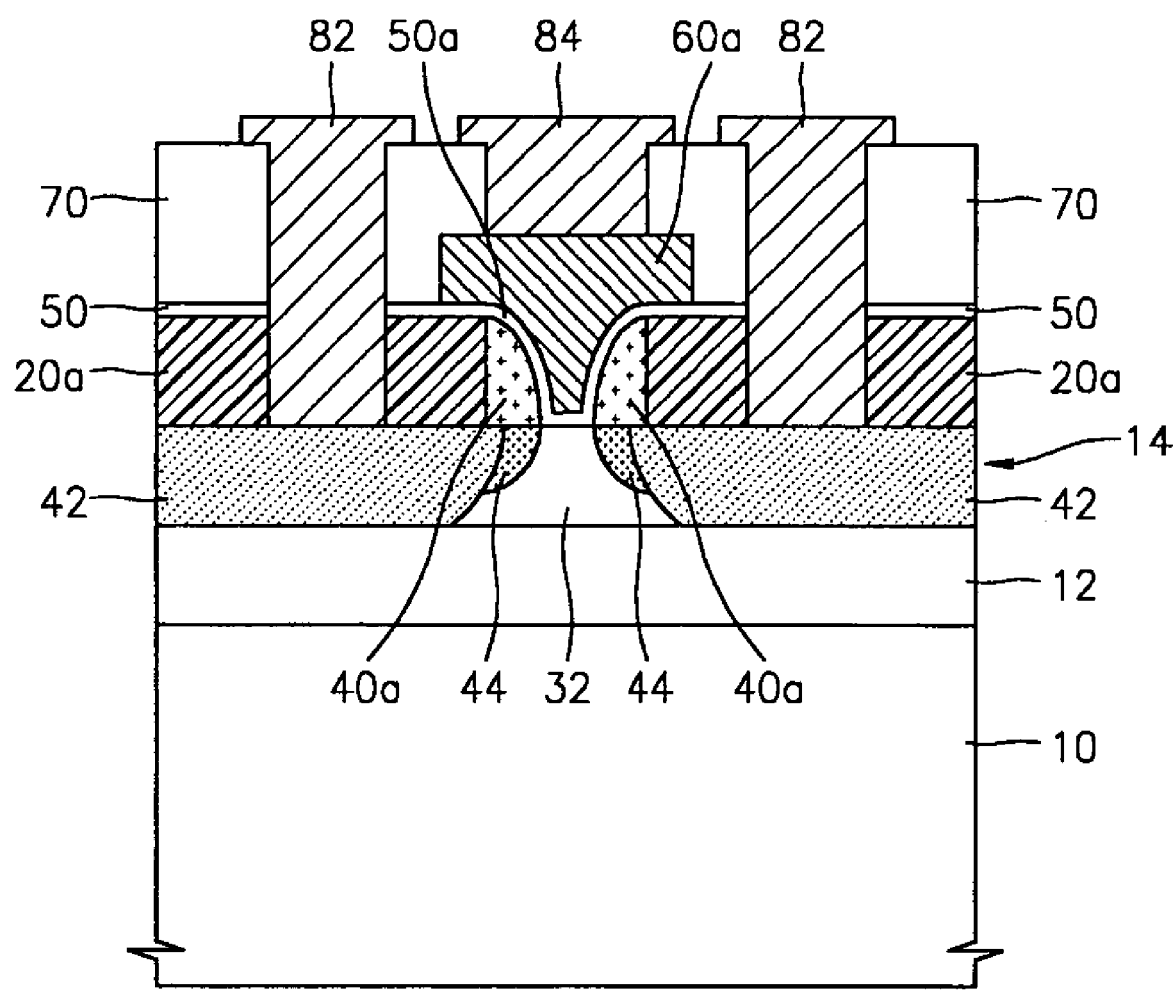

Referring to FIG. 12, the contact holes 72 and 74 are filled with a conductive material to form power lines 82 and 84. Accordingly, the SOI MOSFET device with a nanoscale channel is completed.

In the method of manufacturing the MOSFET device according to the present invention, the shallow extension region and the deep junction region intended for the source/drain region are formed using the first and second silicon oxide films doped with different impurities, and then, the gate electrode is formed. Therefore, a nanoscale channel can be easily formed without a burden of using photomask and lithography processes. That is, the effective channel length of the device can be scaled down by adjusting the thickness and etching rate of the second silicon oxide film doped with the second impurity. Furthermore, the first impurity of the first silicon oxide film pattern and the second impurity of the second silicon oxide film spacer diffuse by rapid thermal process, thereby forming the source/drain region including the shallow extension region and the deep junction region. Therefore, an ultra-shallow junction and a deep contact junction can be accomplished at the same time.

According to the present invention, since an impurity diffuses from a solid-phase diffusion source, a crystal defect of the substrate does not occur, thereby decreasing a junction leakage current. This is in contrast to a conventional method of forming a source/drain using ion implantation that causes a crystal defect in a substrate, thereby generating a serious leakage current.

In addition, the method of manufacturing the MOSFET device according to the present invention can lower the temperature for a subsequent thermal process after forming the gate dielectric film, thereby minimizing a concentration change of an impurity in the channel and thus decreasing a change of the threshold voltage of the device. Therefore, deterioration of device properties by a short-channel effect can be prevented, thereby ensuring the reliability of the device. Furthermore, the low temperature for the subsequent thermal process is advantageous in forming the insulator with a high dielectric constant and the gate electrode made of polycrystalline silicon or metal.

Therefore, the present invention can be effectively used in manufacturing a high performance, low-power and high-speed driving, highly integrated SOI MOSFET device and circuit with a nanoscale channel.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A metal-oxide-semiconductor field effect transistor (MOSFET) device comprising:
    a channel region formed on a monocrystalline silicon layer of a siliconon-on-insulator (SOI) substrate;
    a source/drain region formed in the monocrystalline silicon layer and comprising a deep junction region and a shallow extension region;
    a first silicon oxide film pattern formed on the monocrystalline silicon layer to contact the deep junction region and doped with a first impurity of a first conductivity type at a first concentration;
    a second silicon oxide film spacer formed on the monocrystalline silicon layer to contact the shallow extension region and doped with a second impurity of the first conductivity type at a second concentration;
    a gate electrode formed on the channel region and having a T-shaped section; and
    a gate dielectric film interposed between the channel region and the gate electrode.

2. The MOSFET device of claim 1, wherein the second silicon oxide film spacer contacts a sidewall of the first silicon oxide film pattern.

3. The MOSFET device of claim 1, wherein the second silicon oxide film spacer has an outer wall defining the length of the channel region.

4. The MOSFET device of claim 1, wherein the gate electrode is formed on the first silicon oxide film pattern and the second silicon oxide film spacer.

5. The MOSFET device of claim 1, wherein the first concentration is higher than the second concentration.

6. The MOSFET device of claim 1, wherein the first impurity and the second impurity are different from each other.

7. The MOSFET device of claim 6, wherein the first impurity is phosphorus(P) and the second impurity is arsenic (As).

8. The MOSFET device of claim 1, wherein the gate dielectric film is extended to between the first silicon oxide film pattern and the gate electrode and between the second silicon oxide film spacer and the gate electrode.

* * * * *